US008519719B2

(12) United States Patent
Coster et al.

(10) Patent No.: US 8,519,719 B2
(45) Date of Patent: Aug. 27, 2013

(54) SYSTEM FOR COMPLEX IMPEDANCE MEASUREMENT

(75) Inventors: Hans Gerard Leonard Coster, Randwick (AU); Terry Calvin Chilcott, Sans Souci (AU)

(73) Assignee: Inphaze Pty Ltd, Sydney, New South Wales (AU)

( * ) Notice: Subject to any disclaimer, the term of this patent is extended or adjusted under 35 U.S.C. 154(b) by 555 days.

(21) Appl. No.: 12/303,869

(22) PCT Filed: Jun. 14, 2007

(86) PCT No.: PCT/AU2007/000830
§ 371 (c)(1),
(2), (4) Date: Jun. 7, 2010

(87) PCT Pub. No.: WO2007/143786
PCT Pub. Date: Dec. 21, 2007

(65) Prior Publication Data
US 2010/0237851 A1  Sep. 23, 2010

(30) Foreign Application Priority Data
Jun. 16, 2006 (AU) ................................ 2006903255

(51) Int. Cl.
*G01R 27/28* (2006.01)
*G01R 25/00* (2006.01)
(52) U.S. Cl.
USPC ........................................ 324/615; 324/76.77
(58) Field of Classification Search
USPC ............................................ 324/615, 76.77
See application file for complete search history.

(56) References Cited

U.S. PATENT DOCUMENTS

| 3,082,374 | A | * | 3/1963 | Buuck ........................... 324/73.1 |
| 4,214,203 | A | | 7/1980 | Coster et al. |
| 6,076,951 | A | | 6/2000 | Wang et al. |
| 7,010,981 | B1 | | 3/2006 | Hull |
| 7,295,060 | B2 | * | 11/2007 | Moore ............................... 330/2 |
| 8,140,290 | B2 | * | 3/2012 | Ishida et al. ................... 702/109 |
| 2004/0267497 | A1 | | 12/2004 | Goodman |
| 2005/0031029 | A1 | * | 2/2005 | Yamaguchi et al. ........... 375/226 |
| 2008/0012576 | A1 | * | 1/2008 | Sato et al. ...................... 324/617 |

OTHER PUBLICATIONS

Coster, Hans G.L, Chilcott, Terry C. And Coster, Adelle C.F—Impedance Spectroscopy of Interfaces, Membranes and Ultrastructures, Bioelectrochemistry and Bioenergetics 40 (1996), pp. 79-98.

* cited by examiner

*Primary Examiner* — Jeff Natalini
(74) *Attorney, Agent, or Firm* — Thomas Horstemeyer LLP

(57) ABSTRACT

A measurement system is provided for measuring a complex transfer function of a system under test. The measurement system comprises a signal source for generating an input signal to be applied to the system under test, a signal detection device for detecting a response signal of the system under test in response to the input signal; and a signal analyzing system for determining the gain and phase shift of the system under test by comparing the response signal to the input signal. The signal analyzing system includes phase adjustment means to adjust a relative phase difference of the detected response signal and input signal; and curve fitting means to identify a phase difference adjustment of the phase adjustment means which gives the best fit of the response signal to the input signal. The phase measurement of the response signal is determined from the best fit phase difference adjustment.

20 Claims, 11 Drawing Sheets

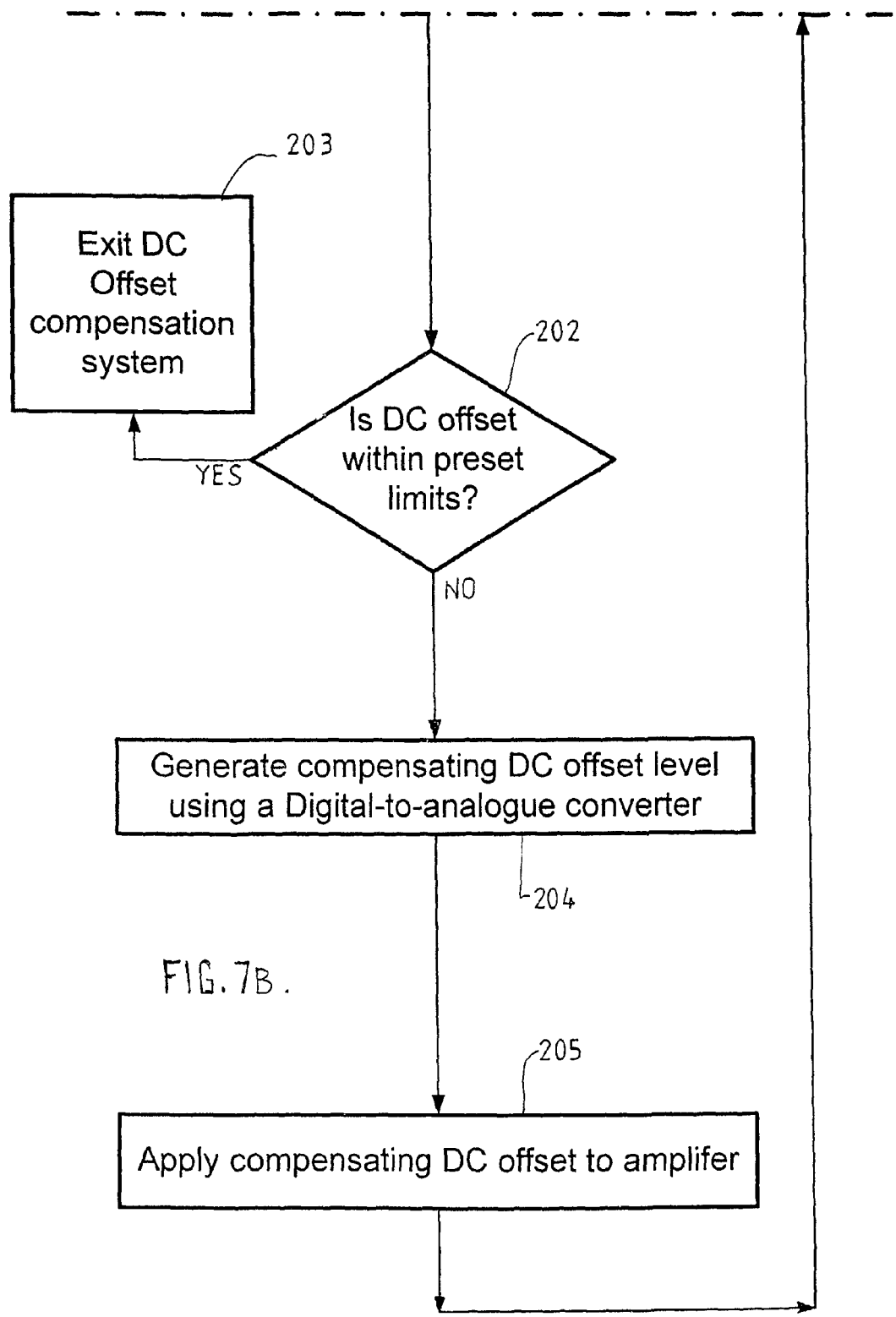

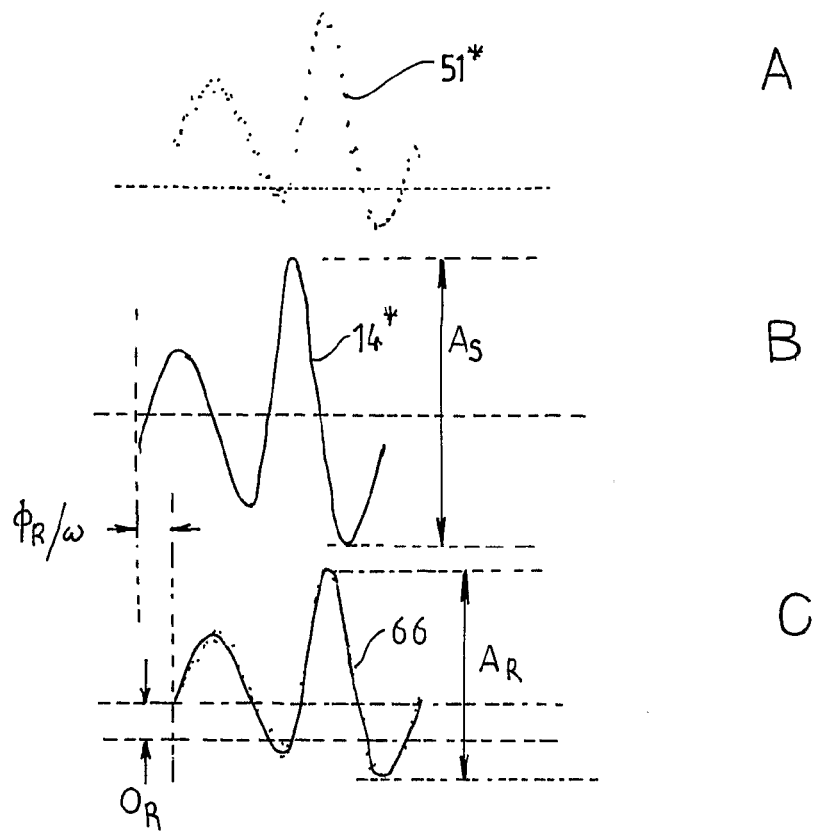
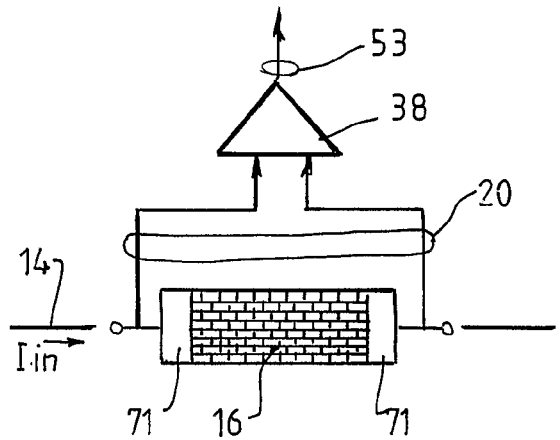
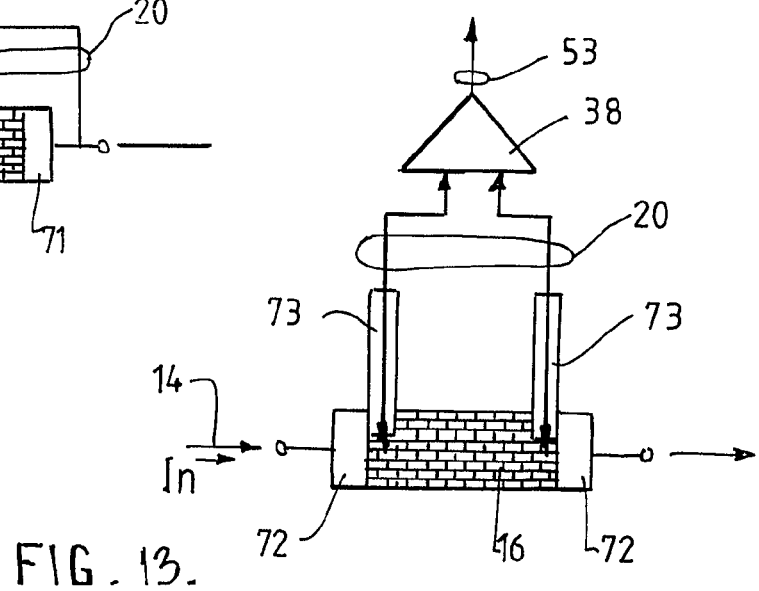

SYSTEM FOR COMPLEX IMPEDANCE MEASUREMENT

CROSS-REFERENCE TO RELATED APPLICATION

This application claims priority to PCT Application No. PCT/AU07/000830, international filing date 14 Jun. 2007, which claims priority to Australian Application No. 2006903255, filed on 16 Jun. 2006.

INTRODUCTION

The present invention relates to the measurement of the dynamic as well as near equilibrium characteristics of a system. More particularly, the present invention relates to a system for complex impedance measurement.

BACKGROUND TO THE INVENTION

Knowledge of the dynamic behavior of a system is beneficial in many science and engineering applications including, for example, electronic systems, electrical systems, acoustic systems, hydrodynamic systems, biosensors, biomimetics and nanotechnology. The dynamic behavior of a system is defined by the relationship between an input or stimulus to a system and the output or response of the system to that input. Under analysis of a system in the frequency domain, the relationship between the stimulus and the response is commonly referred to as a system's transfer function.

In order to determine the transfer function of a system it is necessary to calculate the magnitude of the response which we here refer to as the "gain" of the system and the phase shift between the stimulus and the response. Generally, the gain and phase shift are based on measurements of an input waveform applied to the system and the resulting response waveform of the system. However, in practice there are limitations to obtaining accurate stimulus and response measurements.

One difficulty in making such measurements arises when coupling a stimulus to a system and when coupling response measurement instrumentation to the system as the coupling equipment introduces additional signals such as noise. Errors in transfer function calculation occur because the response measurements will include the additional signals superimposed such that the resultant transfer function is not an accurate reflection of the dynamic behavior of the system.

In order to reduce the effect associated with interface equipment a first set of interface elements may be used to apply the stimulus to the system and a second set of interface elements may be used to measure the response. However, in order to reduce the effect of the interface equipment, the first and second interface elements must have very high sensitivity capabilities which adds substantially to the cost of the equipment.

A further difficulty in making accurate measurements to determine a transfer function of a system arises due to the presence of background signals which, although undesirable, are unavoidable. These background signals are included in the measurement of the response waveform and thus a true response waveform is not sampled. For example, background signals can arise from nonlinear characteristics of a system which distort response waveforms. Even when a stimulus of very small amplitude is applied in an attempt to reduce errors arising from nonlinearities in the response system other background components may be present in the responses. Such other background components may include, for example, transient responses of a system, distortion generated by the acquisition instrumentation, thermal fluctuations and other dynamic fluctuations generated by the system and noise generated by the instrumentation.

U.S. Pat. No. 4,214,203 to Coster et al relates to a method of measurement of electrical impedance by measuring the gain and phase shift of sinusoidal waveforms. The method described is limited to electrical impedance measurement and, in particular, to a stimulus having a sinusoidal waveform of a single frequency. In order to obtain the transfer function of a system by applying the method of U.S. Pat. No. 4,214,203 the stimulus must be applied at a first frequency, then at a second frequency and so on over a range of frequencies to measure a spectrum of impedances and to thereby obtain the transfer function of the system to a sinusoidal stimulus.

U.S. Pat. Nos. 6,556,001 and 6,885,960 relate to a method of acquiring impedance spectra of non-stationary systems dynamically. Generally, U.S. Pat. Nos. 6,556,001 and 6,885,960 relate to the concept of using complex waveforms consisting of a combination of sinusoidal waveforms of various amplitudes and frequencies used to acquire impedance spectra of systems more rapidly. In particular, U.S. Pat. Nos. 6,556,001 and 6,885,960 use a stimulus of structured noise wherein the structured noise is achieved by the superposition of a finite number (between 5 and 50) of sinusoidal oscillations. Such a stimulus may cover a wide bandwidth and a range of amplitudes. By using such waveforms as a stimulus to a system together with response analysis, involving Fourier de-convolution techniques, impedance spectroscopy data can be acquired more rapidly. However, the very large number of frequency components to be extracted from the responses fundamentally limits the resolution of relative phase and amplitudes of the individual sinusoidal components. While this method provides useful information about the impedance of a system at a number of different frequencies simultaneously, the method is not applicable to the measurement of a transfer function for the case of arbitrary waveforms and cannot provide very precise measurement of the phase of either the waveform component in the responses independently of the amplitude of background components or of the individual sinusoidal components in the responses to the stimulus when the latter is comprised of a combination of sinusoidal waveforms.

A common method used to measure the phase difference between, for example, two sinusoidal waveforms is to measure the time delay between zero crossings of a stimulus waveform and a response waveform. This is essentially an analogue method, even when the timing between zero crossings is performed digitally. However, in practice the accuracy of this method is limited by noise being superimposed onto the response waveform which results in a plurality of erroneous zero crossings. Further limitations arise due to DC offsets in the response which usually lead to a shift in the zero-crossing point. For complex waveforms, such as waveforms composed of multiple sinusoidal components, there may be several zero crossings within each period, which would lead to an ambiguity in the phase difference measured between the stimulus and the response. It is inherently difficult to measure zero crossings due to finite thresholds and hysteresis in real measurement devices.

Traditional methods of determining relative phase typically are not suitable for use with arbitrary waveform stimuli including arbitrary waveforms constructed from a combination of sinusoidal signals using the mathematical method of Fourier synthesis.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY OF THE INVENTION

In one aspect, the present invention provides a measurement system for measuring a complex transfer function of a system under test, the measurement system comprising:

a signal source for generating an input signal to be applied to the system under test;

a signal detection device for detecting a response signal of the system under test in response to the input signal; and a signal analyzing system for determining the gain and phase shift of the system under test by comparing the response signal to the input signal, the signal analyzing system including:

phase adjustment means to perform a relative shift of the detected response signal and input signal along a time axis to adjust a relative phase difference therebetween; and curve fitting means to identify a phase difference adjustment of the phase adjustment means which gives the best fit of the response signal to the input signal, wherein the phase measurement of the response signal is determined from the best fit phase difference adjustment.

Preferably, the signal analyzing system further includes gain adjustment means to adjust relative amplitudes of the detected response signal and the input signal and the curve fitting means further comprises identifying means to identify an amplitude difference between the response signal and the input signal and gain adjustment means responsive to the identifying means to match the amplitudes of the response and input signals. The curve fitting means preferably also identifies an amplitude, adjustment which gives the best fit of the detected response signal to the input signal, wherein a gain measurement of the response signal is determined from the amplitude adjustment giving the best fit, the curve fitting for phase and gain determination being performed in concert to obtain the best fit to the input waveform.

In a further aspect, the present invention provides a method of measuring a complex transfer function of a system, the method comprising:

generating an input signal to be applied to a system under test;

detecting a response signal of the system under test in response to the input signal;

determining the gain and phase shift of the system by comparing the response signal to the input signal, the comparison including:

adjusting a relative phase difference of the detected response signal and input signal by performing a relative shift the signals on a time axis; and curve fitting the phase adjusted signals to identify a phase difference adjustment which gives the best fit of the input signal to the response signal, wherein the phase measurement of the response signal is determined from the best fit phase difference adjustment.

Preferably, the method further includes relatively adjusting amplitudes of the detected response signal and input signal; and curve fitting the amplitude adjusted signals to identify an amplitude adjustment which gives the best fit of the input signal to the response signal, wherein the gain measurement of the response signal is determined from the best fit amplitude adjustment, the curve fitting for phase and gain determination being performed in concert to obtain the best fit to the input waveform.

The response signal will generally include at least a response component and a background component and by comparing the response signal to the input signal the signal analyzing system may identify the background component from the response component while determining the gain and phase shift of the system.

The signal source may generate an input signal having an arbitrary waveform. The arbitrary waveform may be defined by a plurality of superimposed sinusoidal waveforms. Preferably, the arbitrary waveform is periodic. The waveform may be defined digitally and stored in an electronic memory. Preferably, the stored waveform includes at least one full cycle of the arbitrary waveform. However, the stored waveform could include several cycles.

Preferably, the input signal is generated using a clocking system to sequentially and repeatedly read the stored waveform from the electronic memory at a predetermined clock rate. In preferred embodiments of the device, the maximum frequency of the input signal is determined by the clock rate and is no more than 50% of the clock rate and preferably at least an order of magnitude lower than the clock rate.

The digital read out of the input signal may be converted into an analogue electrical input signal using a digital-to-analogue converter (DAC). The analogue electrical input signal may be amplified and smoothed using filters and, if required, converted to a desired type of signal (i.e. the signal transmission medium) for a specific application by use of appropriate transducers. For example, the electrical signal may be converted to an acoustic signal or a hydrodynamic signal.

The system under test may be, for example, a chemical system, a biochemical system, a mechanical system, an electronic system, an electrical system, a geological system, an acoustic system or a hydrodynamic system. In addition, the input signal may also be applied to a reference system of which the dynamic properties are known. The response component of the response signal of the system under test may be compared to a response of the reference system to compensate for artefacts of the measurement system or the transducers used to interface to the system under test.

The measurement system is particularly useful for measuring complex electrical impedance of a variety of systems including chemical systems, biological systems, electronic systems, electrical systems, geological systems, membranes, biosensors, biomimetics and nanotechnology.

The response component of the response signal of the system under test may represent the dynamic response of the system. The background component of the response signal may include undesirable signals which do not relate to the dynamic behavior of the system under test. The background component may be superimposed on the response signal and may include, for example, noise developed by componentry of the device and the system, DC offsets, transient responses to the input signal, non-linear characteristics of the system under test, induced electrical noise and crosstalk from the stimulus.

The signal detection device may include an amplifier and an analogue-to-digital converter to sample the response signal. Preferably, the signal detection device samples the response signal in response to clock pulses generated by the clocking system such that the sampling of the response signal is synchronized with the generation of the input signal. The sampled response signal may be stored in the electronic memory.

To distinguish the response component from the background component, the signal analyzing system may mathematically fit the response signal to the input signal and identify the background component. Where a DC offset is present, the DC offset may be obtained by taking the average value of the response signal over a complete cycle. Amplitude and phase values of the input and sampled signals may be adjusted to obtain a best fit of sampled response signal to the original input signal. The fitting process may minimize the square of the deviation of the sampled response component from the known input signal (least squares method).

Preferably, the signal analysis includes feedback of the response signal. The feedback may be used to adjust the amplitude of the input signal to maintain operation of the measurement system and the system under test within a linear range. Preferably, the feedback is used to adjust the gain and offset of the input signal to produce a response signal of near maximum amplitude and minimum offset without clipping of the response signal. The feedback may also provide compensation for errors introduced by, for example, the spectral phase and gain response of any amplifiers, ADCs and other circuitry etc.

In preferred embodiments, the mathematical fitting acts as a digital filter that reduces the effect of the background component in determining the dynamic characteristic of the system under test. For example, where the response signal is a complex waveform defined by the superposition of at least two sinusoidal waveforms a plurality of zero-crossings may occur within each period. Mathematical fitting may reduce the errors associated with erroneous zero-crossings in determining the phase shift.

Preferred embodiments provide an improved system for making precise measurements of the gain and phase shift of the system under test based on a stimulus of arbitrary waveform and the resultant response waveform. The preferred embodiments utilise specially constructed stimulus waveforms composed of a plurality of sinusoidal components to make gain and phase shift measurements at a plurality of frequencies. This is particularly advantageous at very low frequencies.

BRIEF DESCRIPTION OF THE DRAWINGS

Embodiment of a system for complex transfer function measurement, and in particular complex impedance measurement, will now be described, by way of example, with reference to the accompanying drawings in which:—

FIG. 11 graphically illustrates curve fitting as described with reference to FIG. 10 in which FIG. 11A graphically illustrates a stimulus waveform applied to system under test, in which: FIG. 11B graphically illustrates the stimulus waveform applied to the system to produce the response sampled in FIG. 11A; FIG. 11A graphically illustrates a series of sampled data points sampled from a response of the system under test (see FIG. 1) to the stimulus illustrated in FIG. 11B; FIG. 11C illustrates the stimulus waveform of FIG. 11A mathematically fitted to the data points of FIG. 11B by adjustment of a phase and DC offset applied to the stimulus waveform;

FIG. 12 illustrates a method of connecting the system of FIG. 1 to a system to be tested using a two terminal connection arrangement; and FIG. 13 illustrates a method of connecting the system of FIG. 1 to a system to be tested using a four terminal connection arrangement;

DETAILED DESCRIPTION OF A DEVICE FOR COMPLEX IMPEDANCE MEASUREMENT

Figure 1:
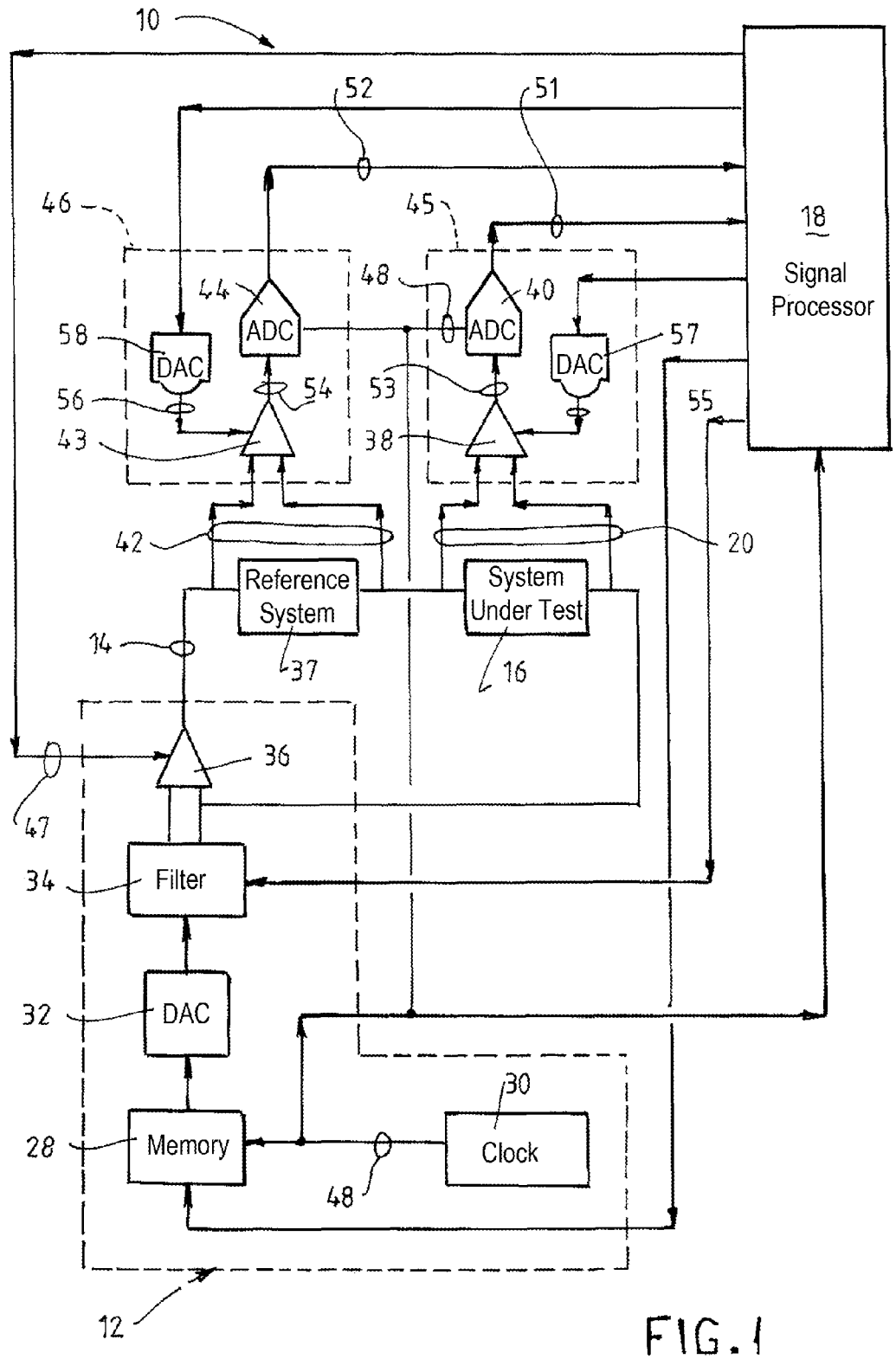
FIG. 1 shows a block diagram of a spectrometer in accordance with an embodiment of a measurement system for complex transfer function measurement.

With reference to FIG. 1 of the drawings, a system 10 for complex impedance measurement is illustrated schematically. The system 10 comprises a voltage signal source 12 for generating an input signal 14 to be applied to a system under test 16 and a reference system 37. The system 10 also includes a pair of detection circuits 45, 46 for detecting a response signal 20, of the system under test 16 and a response signal 42 of the reference system 37, in response to the input signal 14. The response signals 20, 42 typically include at least a response component 22 and a background component 24 (see FIG. 4). The system 10 further includes a processing system 18 which performs a signal analysis function that determines the gain and phase shift of the system 16 by comparing the response signal 20 to the input signal 14, and distinguishes the response component 22 from the background component 24 of the response signal 20. In the arrangement illustrated in FIG. 1 the reference system 37 and the system under test 16 are each two terminal systems and the characteristics of the system under test 16 are determined by comparing the ratio of the responses of the system under test 16 and the reference system 37 and using the known characteristics of the reference system to calculate the characteristics of the system under test.

The stimulus signal consists of an arbitrary waveform which is digitally defined and a full cycle of which is stored in an electronic memory 28 of the signal source 12. The arbitrary waveform may be a complex waveform defined by superimposing a plurality of periodic waveforms. Each periodic waveform may be a specific waveform, for example, sinusoidal, saw-tooth, triangle or square.

To read the arbitrary waveform from the electronic memory 28, a digital clock 30 is used to generate a pulsed clock signal 48 at a clock rate which determines the frequency range of the measurement. The clock rate determines the period T (see FIG. 4), and hence the frequency, of the arbitrary waveform 14. The digital read out of the arbitrary waveform is then converted to an analogue signal by a digital-to-analogue converter (DAC) 32 and smoothed by filters 34. The analogue signal is then passed through an amplifier 36 in order to amplify the signal and produce the input signal 14 to be applied to the system under test 16 and the reference system 37. However, it is important that the amplifier 36 operates within its linear operating range, and to achieve this it has a gain control input to which a gain control signal 47 is supplied from the processor 18, as will be described in more detail below. The clock signal 48 is also provided to the processor 18 to enable synchronization of the input and response signals during analysis.

Figure 2:
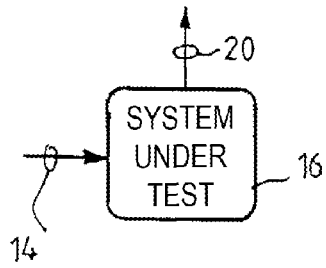
FIG. 2 schematically illustrates a method of measuring a system response in which a stimulus is applied only to a system under test.
Figure 3:
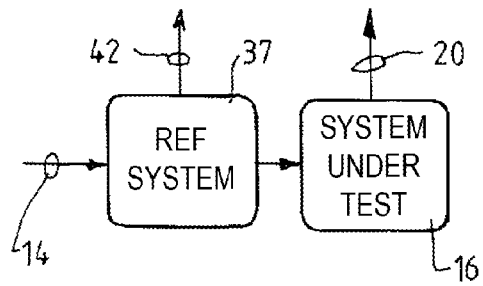
FIG. 3 schematically illustrates a method of measuring a system response in which a stimulus is applied to both a reference system and a system under test.

As described above with reference to FIG. 1, the input signal 14 may be applied to a reference system 37, with known characteristics, as well as the system 16 under investigation as indicated in FIG. 3 or alternatively the input signal 14 may be applied only to the system 16 to be characterized as shown in FIG. 2. In the illustrated embodiment of FIGS. 1 & 3, the input signal is a voltage signal and the inputs of the test and reference systems are connected in series. However, it will be recognized that in some circumstances, depending upon the type of systems under test, an input may require to be driven by a current signal and/or the test and reference inputs may be connected in parallel.

Figure 4:
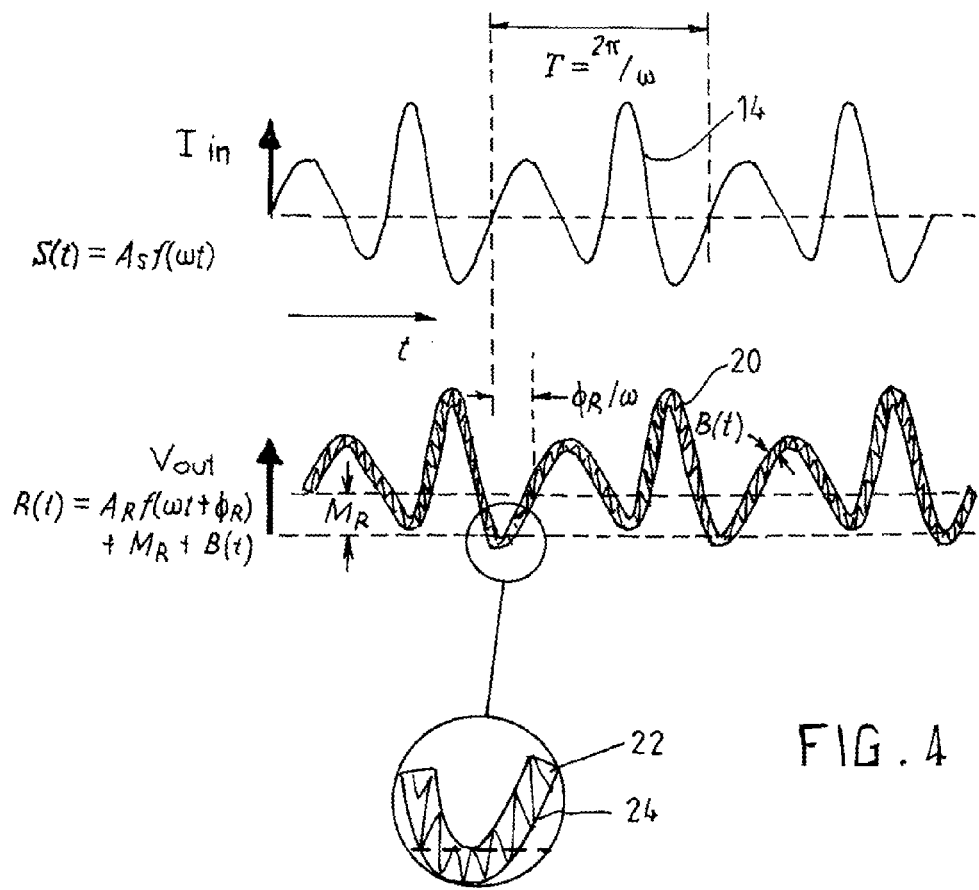
FIG. 4 graphically illustrates a stimulus waveform and a response waveform to the stimulus for the system of FIG. 1.

The input signal 14 will cause the system under test 16 to produce a response signal 20 which in this case is a differential signal. Similarly the input signal 14 will cause the reference system 37 to produce a differential response signal 42. In order to measure the response signals 20, 42, the response signals 20, 42 are passed through output amplifiers 38, 43 and then digitally sampled by analogue-to-digital (ADC) converters 40, 44. The output offsets of output amplifiers 38, 43 are adjusted to avoid clipping by control signals 55, 56 provided from the processor 18 via D/A converters (DACs) 57, 58. For complex waveforms at least one full cycle of each of the digitized response signals 51, 52 are then passed to the processor 18 for storage and analysis. For pure sinusoidal waveforms it is possible to work with a smaller fraction of a complete cycle of the sine wave although it remains preferable to work with at least one complete cycle. The pulsed clock signal 48 of the clock 30, which is used to clock the arbitrary stimulus waveform from the electronic memory 28, are also used to clock the sampling of the amplified response signals 53, 54 so that the sampled response signals 51, 52 are synchronized with reading out from the digital waveform storage 28 of digital components used to create the input signal 14. Synchronizing the generating of the input signal 14 and the sampling of the response signals 20, 42 reduces errors in measurement of the phase shift ($\Phi_R/\omega$) in particular, errors caused by erroneous zero-crossings as shown in FIG. 4.

Once the response signals 20, 42 have been sampled and stored within electronic memory in processor 18, the signal analysis function within processor 18 analyzes the response of the system under test 16 and the reference system to determine and compare the respective transfer functions.

Figure 5A:
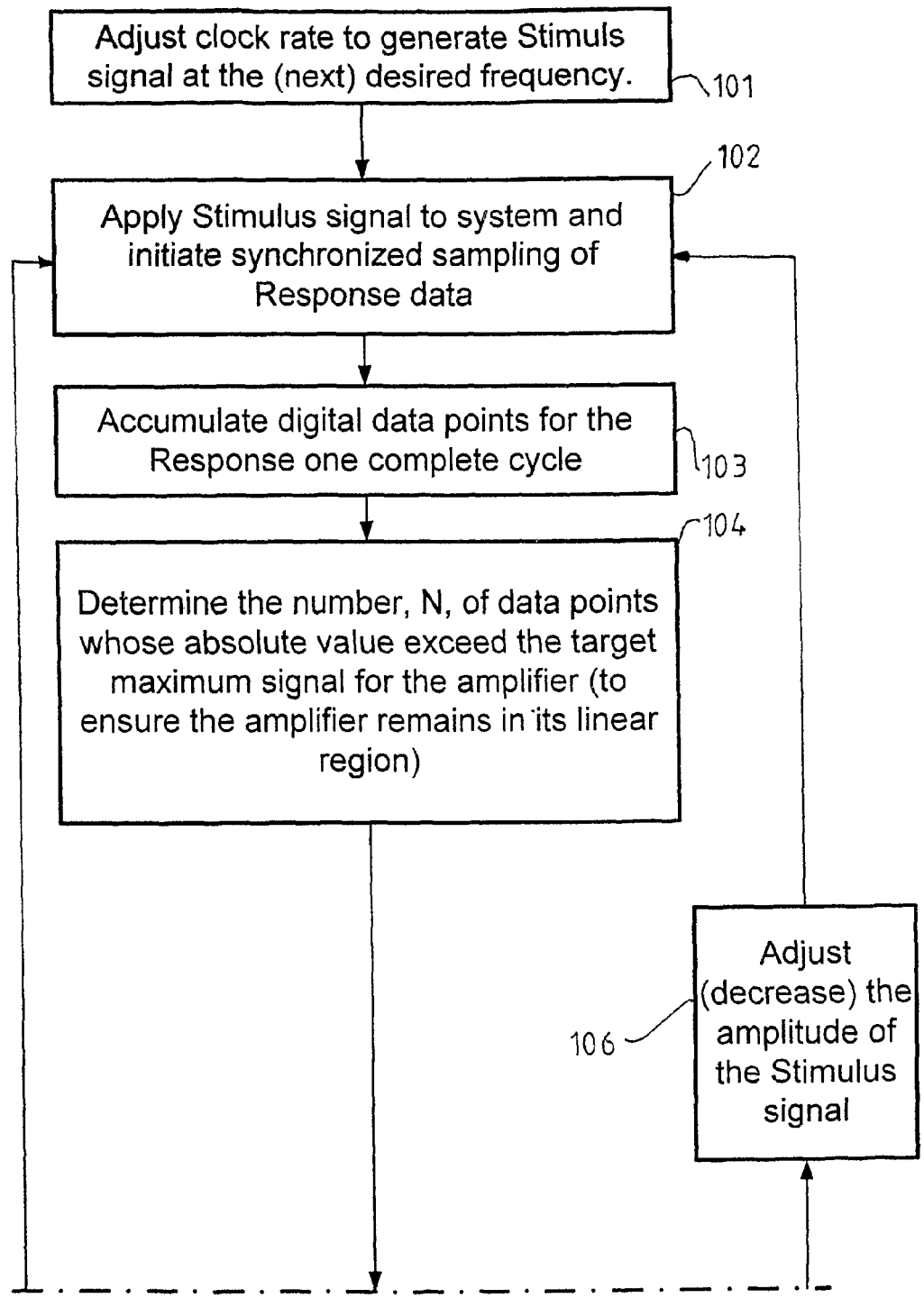
FIG. 5 shows a flowchart illustrating a method of clipping correction and level correction of a response in a system of the type illustrated in FIG. 1.
Figure 5B:
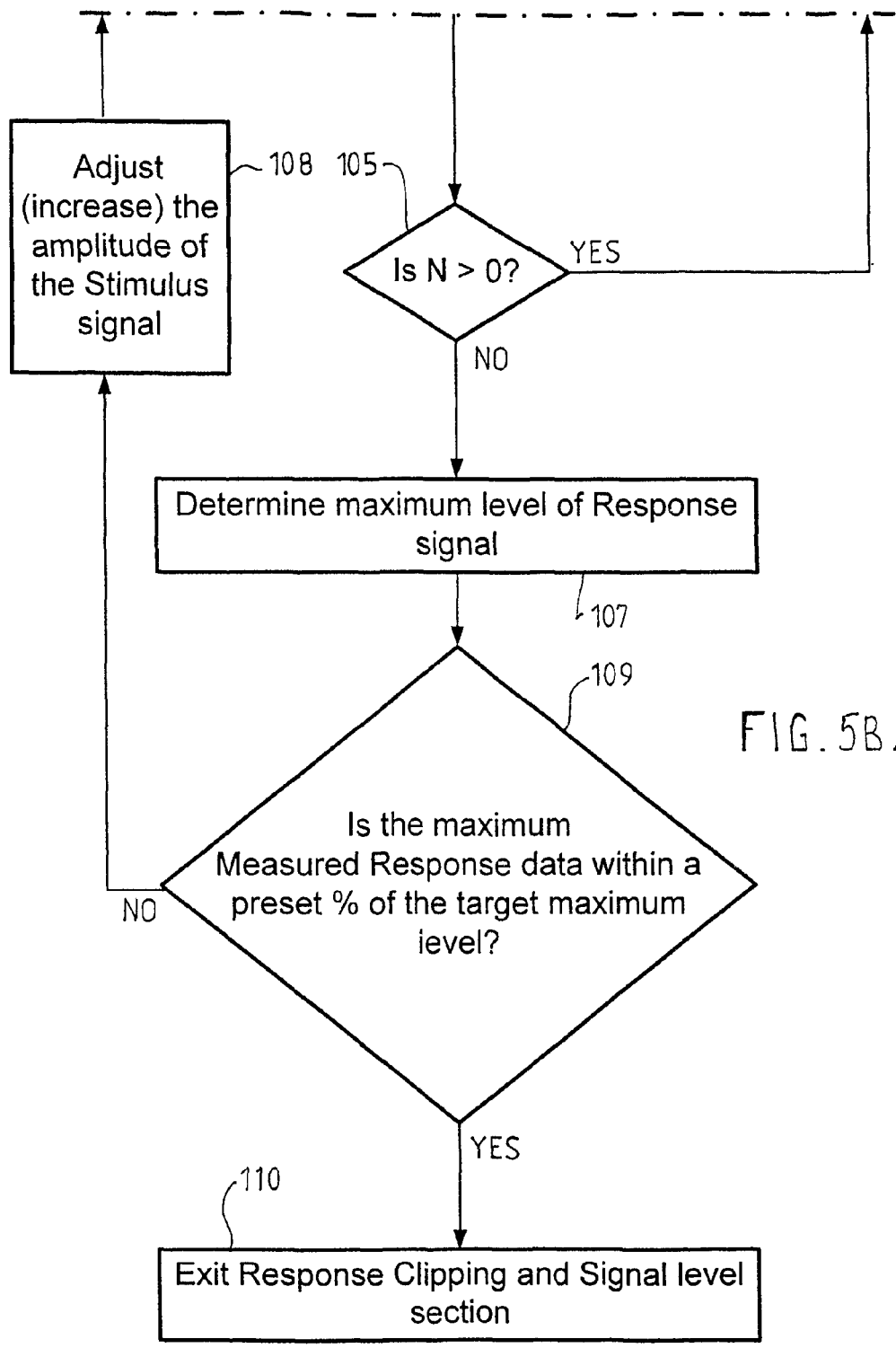
Figure 6:
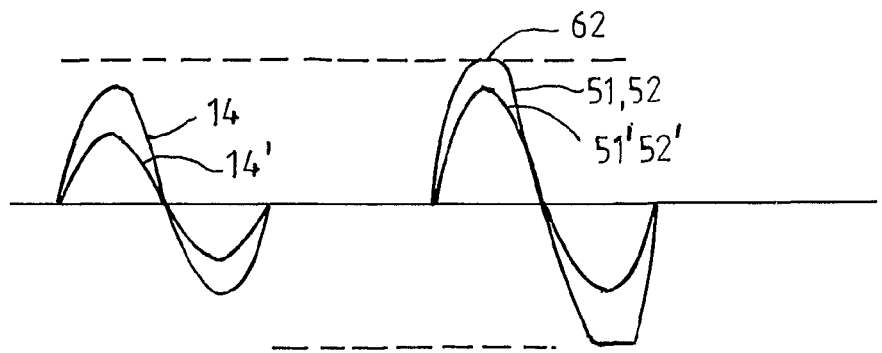
FIG. 6 graphically illustrates a correction of the type illustrated in FIG. 5 to prevent output clipping due to system gain.

With reference to FIGS. 5 and 6, the first stage of the signal analysis, the clock rate of clock 30 is adjusted 101 by the processor 18 to establish the desired frequency range for the next measurement. The next step is to determine whether or not the amplifiers 38, 43 are operating within their linear operating range. The stimulus signal 14 is then applied 102 to the system under test and the response signal sampled and accumulated 103. The number of accumulated samples exceeding a predetermined maximum amplified signal level are then counted 104 by determining the absolute value of each sampled data point of the sampled response signals 51, 52 and comparing these values with the maximum allowable output levels of the amplifiers 38, 43. The count is tested 105 and if any of sampled data points have an absolute value greater than specified maximum linear operating range of the respective amplifier (representing clipping 62 as seen in FIG. 6), the amplitude of the input signal 14 should be decreased 106 to provide a stimulus signal 14' having a smaller amplitude. The new input signal 14' should then be applied to the system under test 16 and the reference system 37 and the new responses sampled and re-checked for linear operation. This process should be repeated until all of the sampled response data points of the sampled response signals 51', 52' are within the linear operating range of the amplifiers 38, 43.

Although it is necessary that the amplifiers 16, 43 operate within their linear range, it is also desirable to have the largest, undistorted response signal 20, 42 possible. Therefore, once the input signal 14 has been reduced sufficiently such that the amplifiers 38, 43 are operating within their linear operating range, the input signal 14 can then be gradually increased again to produce a response of desired magnitude. However, after each increase the response must be checked to ensure that the amplifiers 38, 43 are still operating within their linear range. In this case when no samples are greater than the predetermined maximum value, the value of the largest sample is determined 107 and compared 108 with the predetermined maximum allowed value and if not within a predetermined margin of the maximum allowed value, the input signal 14 is increased 108 and the response checked again. Alternatively if largest sample is within a predetermined margin of the maximum allowed value the clipping and response level routine is exited 111.

Figure 8:
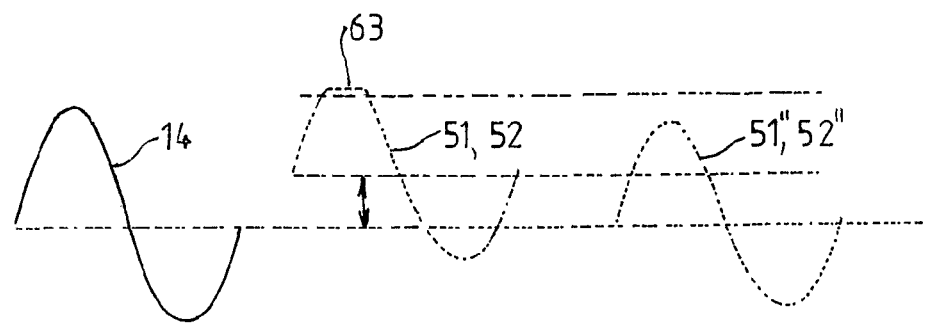
FIG. 8 shows a waveform corrected by compensating according to the method described with reference to FIG. 7 to prevent output clipping due to a DC offset.
Figure 9:
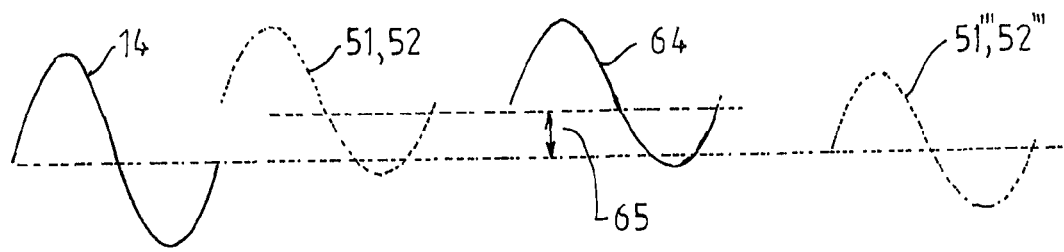
FIG. 9 shows a waveform corrected by compensating for a DC offset according to an alternative method involving curve fitting.
Figure 7A:
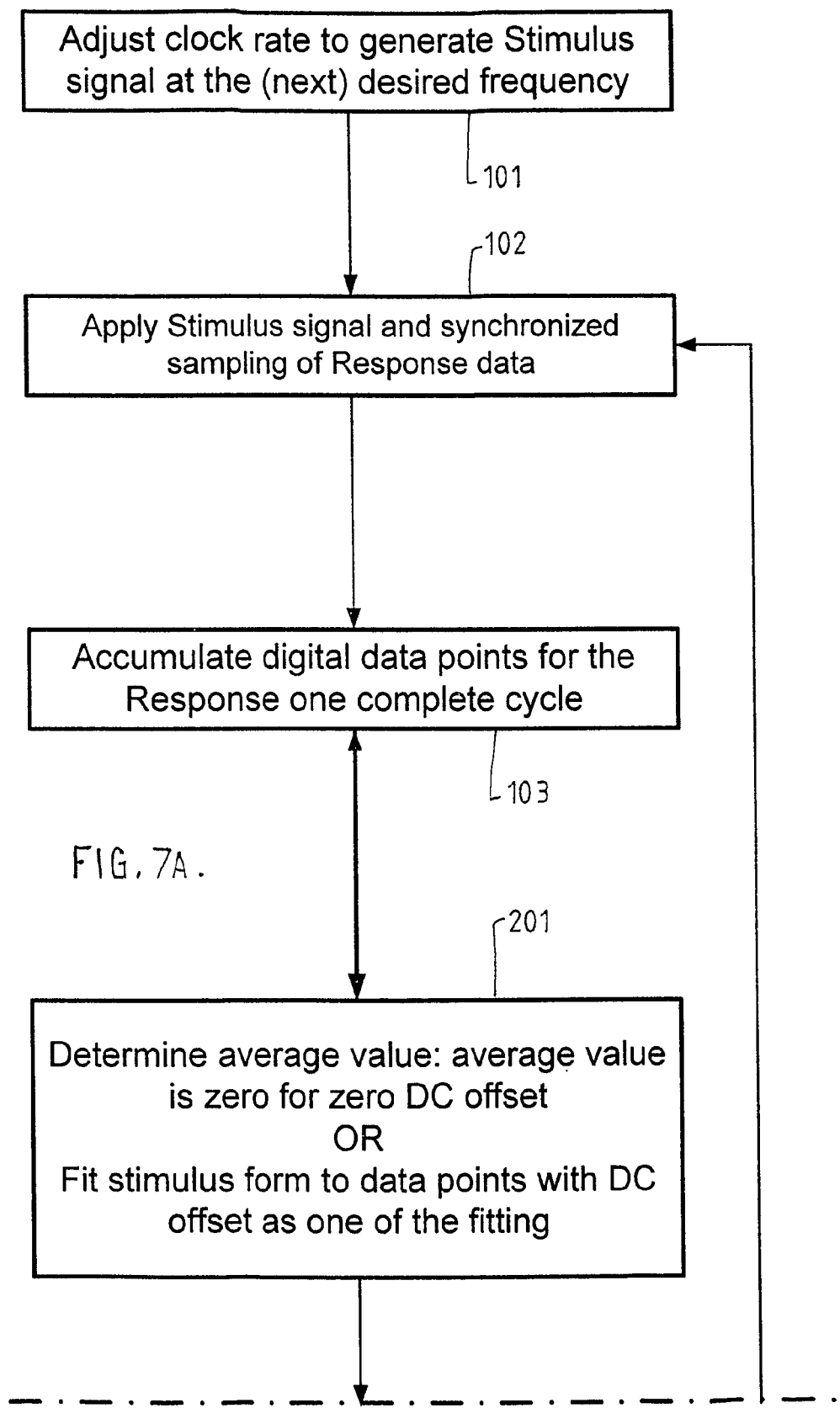
FIG. 7 shows a flowchart illustrating a method of DC offset compensation of a response in a system of the type illustrated in FIG. 1.

The next stage of the signal analysis is to determine if any DC offset is present in the response as illustrated in the Flow Chart of FIG. 7 with wave form examples illustrated in FIGS. 8 and 9. Knowledge of a DC offset is important as it can be used to prevent clipping 63 (see FIG. 8) of the amplified response signals 53, 54, as indicated by the sampled response data points of the sampled response signals 51', 52' exceeding a maximum desired value. The DC offset is determined by calculating the average value of the input signal 14 and the average value of the sampled data 51, 52 of the amplified response signals 53, 54. Once the value of the DC offset is known, a compensating DC offset signal 55, 56 is applied to the output amplifiers 38, 43 via DACs 57, 58, such that the sampled data 51", 52" of the amplified response signals 53, 54 are not clipped at any data points.

Referring to FIG. 7, the process of compensating for DC offset commences, as for the process for clipping and response level correction, with adjustment 101 of the clock rate and application 102 of the stimulus to the system under test and the reference system. The offset in the sampled output 51 is then determined 201 and the average value tested 202. If the average value is within preset limits the offset compensation is complete 203. Otherwise a compensating offset is generated 204 and applied 205 to the output amplifier 38, 43 and the process repeated.

An alternative method of determining the required value of the output offset signal 55, 56 is to curve fit 64 (see FIG. 9) the input signal 14 to the sampled output offset signal 51, 52. adjusting the relative phase, amplitude and offset to minimize the deviation of the two signals being fitted, such that the relative offset adjustment 65 may be used to determine the offset correction 55, 56 required to the output amplifiers 38, 43 such that the sampled data 51''', 52''' of the amplified response signals 53, 54 are not clipped at any data points.

Note that it will sometimes be necessary to iteratively adjust the amplifier gain and offset several times to achieve the optimum conditions for measurement.

Figure 10A:
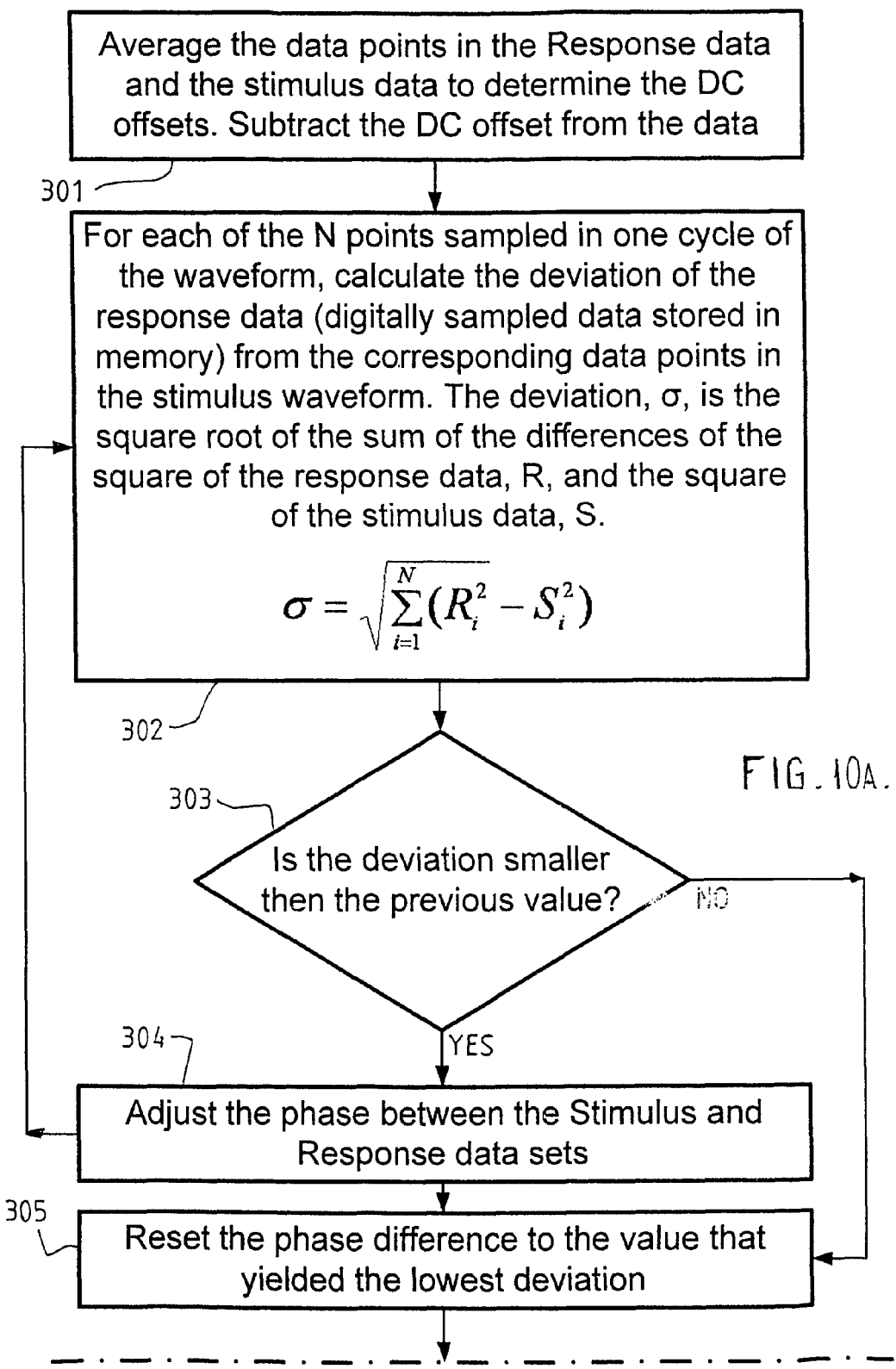
FIG. 10 shows a flowchart illustrating a process of mathematically fitting a response to a stimulus in a system of the type illustrated in FIG. 1.
Figure 10B:
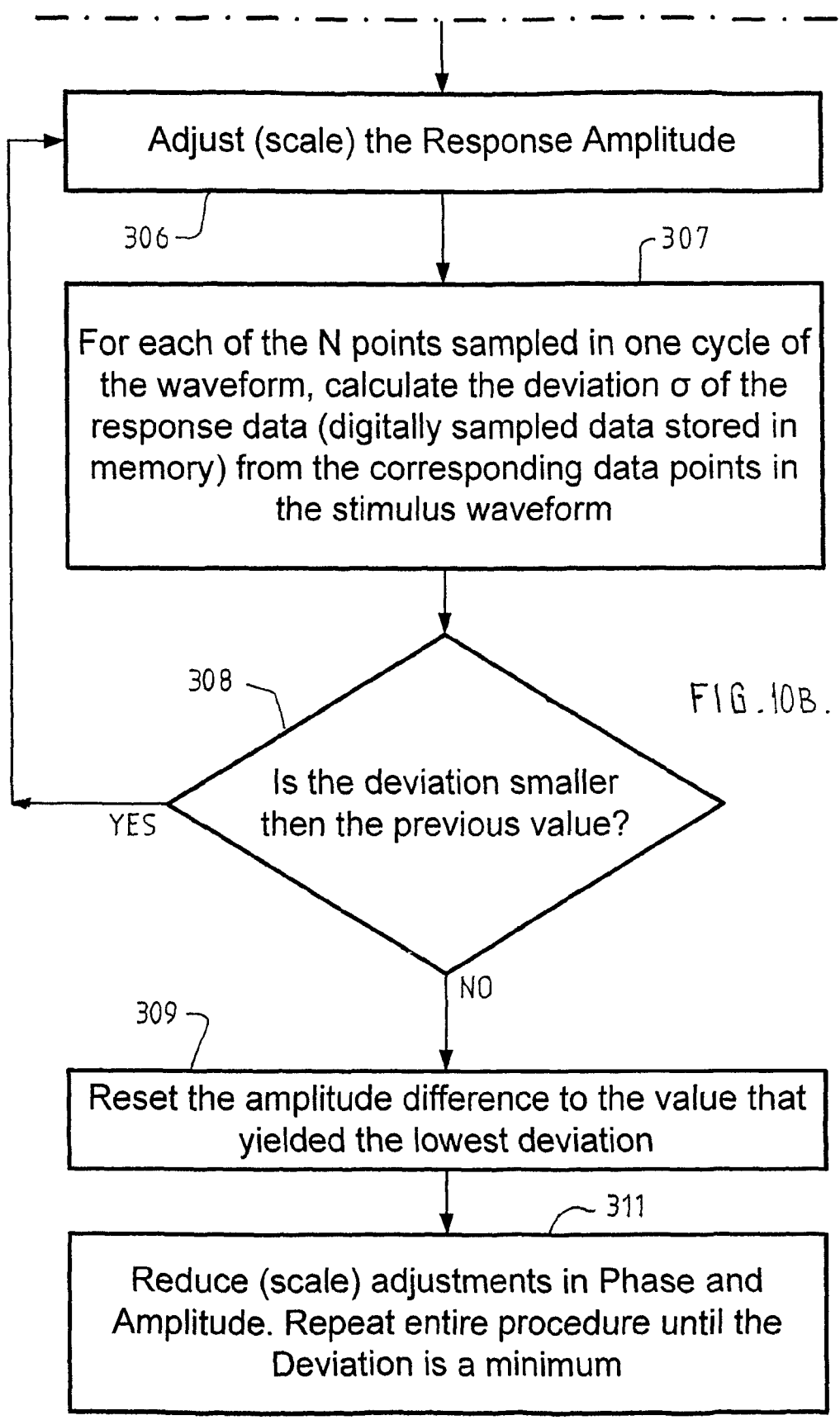

Referring to FIGS. 10 and 11, the final stage of the signal analysis is to rerun the simulation after the compensating adjustments have been made and to characterize the system under test by mathematically fitting the sampled response signal 51 to the input signal 14 so that the complex impedance or dynamic behavior of the system under test 16 can be determined. The same process is also followed for the reference system 37, however, for simplicity it will not be described.

The process of mathematically fitting the sampled, amplified-response signals 51*, to the input signal 14* is carried out with respect to each component of the input signal 14*. As described above, the input signal 14* may be a complex waveform comprising a plurality of waveforms superimposed over each other. In addition, to the known waveform components, background components may also be superimposed on the input signal 14*. Such background components include noise generated from the instrumentation of the system 10. Although the exact form of the noise is not known, by mathematically fitting the response component 22 and background component 24 of the sampled data 51* of the amplified response signal 53 to the input signal 14* it is possible to distinguish the noise waveform from the known components of the input signal 14*. Furthermore, by applying a complex input signal 14* to the system 16, the system response and dynamic behavior can be determined over a wide range of frequencies.

In order to mathematically fit the sampled data 51* of the amplified response signal 53 to the input signal 14*, the input offset $O_I$ and output offset $O_R$ are removed 301 from the input signal 14* and the digitized response signal 51* respectively before the deviation between the output and the input at each data point is calculated 302. The deviation is calculated as the square root of the sum of the differences of the square of the digitized response signal 51*and the square of the input signal 14* as defined by the following formula:

$$\sigma = \sqrt{\sum_{i=1}^{N}(R_i^2 - S_i^2)}$$

where:
σ=deviation;
N=number of data points;
R=response (output) data; and
S=stimulus (input) data.

Calculation of the deviation between the digitized response signal 51*and the input signal 14* is done, separately, with respect to the amplitude data and the phase data. First the deviation σ is compared 303 with the previous calculation of the deviation and if lower the phase of the digitized response signal 51* is adjusted 304 (i.e. shifted on the time axis with respect to the stimulus signal 14*) and the deviation recalculated 302. This process is repeated while the deviation σ continues to reduce. However, if at any time the deviation measured increases between 2 successive iterations, the phase adjustment is reset 305 to the value that produced the lowest deviation (for the current amplitude scaling—see below) and the amplitude scaling is adjusted 306.

Then, the deviation σ is again calculated 307 and compared 308 with the previous calculation of the deviation and if lower the scale of the digitized response signal 51* is again adjusted 306 and the deviation recalculated 307. This process is also repeated while the deviation σ continues to reduce. However, if at any time the deviation measured increases between 2 successive iterations, the scale adjustment is reset 309 to the value that produced the lowest deviation (for the current phase adjustment), the step size of the phase and amplitude scale adjustments is reduced 311 and the whole process is repeated, until the step size has reached a predetermined minimum, when the phase and scale adjustments required to achieve the minimum are used to calculate the phase and amplitude response of the system under test 16.

When the lowest deviation values for amplitude and phase have been determined, the curve of best fit 66 of the response signal can be plotted by applying the inverse phase adjustment ($\Phi_R/\omega$) and the inverse scale adjustment ($A_R/A_S$) to the stimulus signal 14* and applying the output offset ($O_R$).

In order to speed up the iterative procedure of mathematical fitting as shown in the flow diagram of FIG. 10, it is advantageous to adjust those parameters that most effect the deviation. If the mathematical function describing a component of the input signal 14 is known, this can be obtained from the mathematical differential of that function with respect to the parameters to be adjusted. This allows the iteration to be guided and greatly speeds up the fitting process by adjusting the parameters so that the iteration proceeds along a path of greatest descent.

It is an advantage of preferred embodiments of the system 10 and method for complex impedance measurement that the dynamic behavior of a system under test 16 can be determined over a wide range of frequencies by subjecting the system 16 to a complex input signal 14, particularly at low frequencies. It is a further advantage of at least preferred embodiments of the system 10 and method for complex impedance measurement that the dynamic behavior of a system under test 16 can be analyzed with due regard to the effect of background signals acting on the system 16.

As previously mentioned, the system under test 16 may comprise any type of system such as chemical systems, biological systems, electronic systems, electrical systems, membrane systems, acoustic systems, hydrodynamic systems, biosensors, biomimetics and nanotechnology. Depending on the system connection to the measurement apparatus may be via two terminals or four terminals, and referring to FIG. 12, a generic two terminal configuration is illustrated. The electrical stimulus signal 14 is coupled to the system under investigation 16 via transducers 71. In the case of electrical impedance measurements the transducers 71 are electrodes electrically connected to the system, for instance via electrodes immersed in a solution or in contact with biological tissue.

The same point of connection of the stimulus signal 14 to the transducers 71 is also used to measure the response 20 of the system, via the amplifier 38. The 2 terminal configuration measures the response of the system and that of the transducers. If the generalized impedance of the transducer is very high, this 2 terminal configuration will not allow the response of the system itself to be resolved with good precision. Thus, in electrical impedance measurements the transducers are simply electrodes, for instance chemically inert electrodes such as gold, in contact with biological tissue or an electrolyte. However an ionic double layer forms at the interface between such electrodes and the tissue or an electrolyte and the impedance of this interface, particularly at low frequencies, may be much larger than that of the system being investigated.

When two-terminal interfaces are inappropriate, a four-terminal interface, as generally represented in FIG. 13, may be used instead. In this case, the electrical stimulus signal 14 is coupled to the system under investigation 16 via transducers 72 and the response 20 of the system 16 is measured with a second set of transducers 73 which are connected to the amplifier 38. In this arrangement, two point of connection 72 are made to couple the system to the stimulus signal and two additional transducers 73 are used to measure the response of the system to the stimulus. The four terminal configuration measures the response of the system independently of the generalized impedance of the transducers 72 used to couple the stimulus signal to the system. Thus, for instance, in electrical impedance measurements, the transducers 72, 73 are simply electrodes, for instance chemically inert electrodes such as gold, in contact with, for example, biological tissue or an electrolyte. As mentioned previously, an ionic double layer forms at the interface of the input electrodes 72 and the tissue or electrolyte and this impedance, particularly at low frequencies may be much larger than that of the system under investigation, However, in the four terminal configuration the response of the system is measured via the second set of transducers 73 (electrodes in the case of electrical impedance measurements) connected to a high input-impedance amplifier and the impedance so determined is that of the system, independently of the impedance of the ionic double layer at the electrode-tissue interface, provided that the current flowing into the amplifier is very small compared to the stimulus current.

Figure 14:
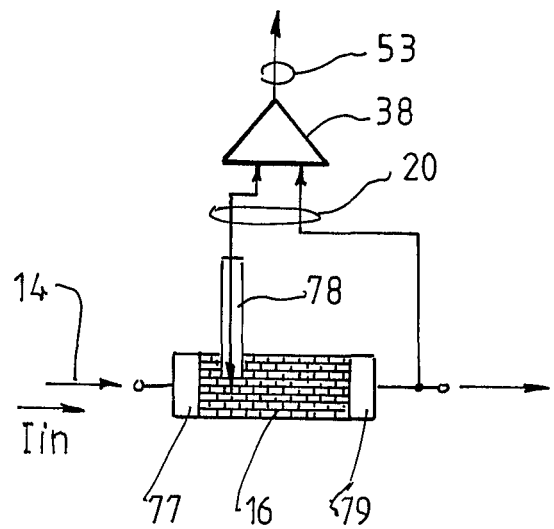
FIG. 14 illustrates a method of connecting the system of FIG. 1 to a system to be tested using a three terminal connection arrangement.

A three terminal configuration for connection to the system under test, as illustrated in FIG. 14, is also useful in some situations in which the electrical stimulus signal 14 is coupled to the system under investigation 16 via transducers 77, 79, and the response of the system is measured using one additional transducer 78 and the point of connection to transducer 79 which is a shared point of connection for both the stimulus applied to the system 16 and the measurement of the response signal 20.

The three terminal configuration measures the response of the system independently of the generalized impedance of the first transducer 77, used to couple the stimulus signal to the system 16, but will be affected by any contribution from the second transducer 79 also used to couple the stimulus signal to the system 16. Thus, for instance, in electrical impedance measurements, where the transducers are again simply electrodes, for instance chemically inert electrodes such as gold, in contact with, for example, biological tissue or an electrolyte, once again an ionic double layer forms at the interface of the electrodes and the tissue or electrolyte with the effects noted above for the previous examples. Similar contact resistance problems arise in other systems. However, in the three terminal configuration the response signal 20 of the system is measured via a third independent transducer 78 (electrodes in the case of electrical impedance measurements) connected to a high input-impedance amplifier and the impedance so determined is that of the system, independently of the impedance of the ionic double layer at the electrode-tissue interface of transducer 77 provided that the current flowing into the amplifier is very small compared to the stimulus current.

In electrochemistry applications the transducer 77 is often referred to as the working electrode whilst transducer 78 is referred to as the reference electrode.

Figure 15:
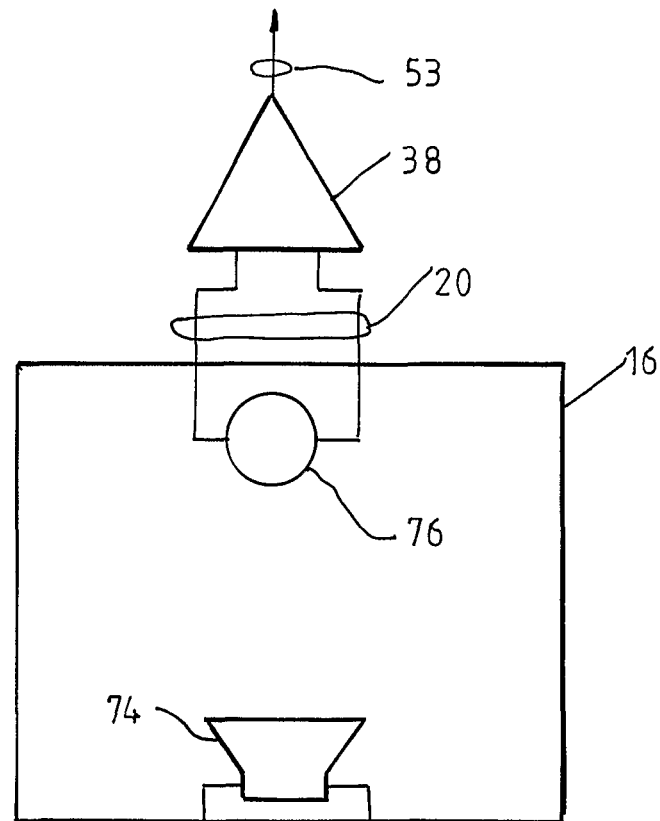
FIG. 15 illustrates a method of connecting the measurement system of FIG. 1 to measure a response of an acoustic system.

The systems described above all measured electrical impedance, but the present system may measure non electrical responses by providing a different interface. By way of example FIG. 15 shows an acoustic system into which a sound or pressure signal is injected and a response measured. In measurements of the acoustic response function of the system 16 of FIG. 15, the electrical input signal 14 is transformed into pressure signals using a pressure transducer 74 which may be for example an acoustic speaker. The speaker may also require a driving amplifier 75 to provide a sufficiently powerful signal depending on the size of the system under test. The response of the system is measured via another transducer 76, such as an acoustic microphone, connected to, or immersed in, the system 16 which convert the pressure in the system 16 to an electrical signal 20 that is amplified using the amplifier 38 with a high input impedance.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A measurement system for measuring a complex transfer function of a system under test, the measurement system comprising:
    a signal source for generating an input signal to be applied to the system under test;
    a signal detection device for detecting a response signal of the system under test in response to the input signal; and
    a signal analyzing system for determining the gain and phase shift of the system under test by comparing the response signal to the input signal,
    the signal analyzing system including:
    phase adjustment means to perform a relative shift of the detected response signal and input signal along a time axis to adjust a relative phase difference therebetween; and
    curve fitting means to identify a phase difference adjustment of the phase adjustment means which gives the best fit of the response signal to the input signal, wherein the phase measurement of the response signal is determined from the best fit phase difference adjustment.

2. The measurement system of claim 1, wherein the curve fitting means further comprises identifying means to identify an amplitude difference between the response signal and the input signal and gain adjustment means responsive to the identifying means to match the amplitudes of the response and input signals.

3. The measurement system of claim 2, wherein the curve fitting means identifies an amplitude adjustment which gives a best fit of the detected response signal to the input signal, and wherein the gain measurement of the response signal is determined from the amplitude adjustment giving the best fit, the curve fitting for phase and gain determination being performed in concert to obtain the best fit of the detected response signal to the input waveform.

4. The measurement system as claimed in claims 3, wherein the signal source includes an electronic memory and the input signal waveform is defined digitally and stored in the electronic memory, the signal source being arranged to generate an input signal having an arbitrary waveform.

5. The measurement system of claim 4, wherein the arbitrary waveform is defined by a single sinusoidal waveform or a plurality of superimposed sinusoidal waveforms.

6. The measurement system of claim 4, wherein the arbitrary waveform is periodic.

7. The measurement system of claim 4, wherein the stored waveform includes at least a portion of a full cycle of the arbitrary waveform from which a full cycle of the waveform can be reconstituted.

8. The measurement system of claim 4, wherein the stored waveform includes a plurality of cycles of the arbitrary waveform.

9. The measurement system as claimed in claim 1, wherein the signal analyzing system includes a feedback path which feeds back the response signal, the fed back response signal being used to adjust the gain and offset of the input signal to produce a response signal approaching a maximum amplitude and minimum offset without clipping of the response signal and to provide compensation for errors introduced by the spectral phase and pain response of amplifiers, ADCs and other circuitry in the measurement system.

10. A method of measuring a complex transfer function of a system, the method comprising:
generating an input signal to be applied to a system under test;
detecting a response signal of the system under test in response to the input signal;
determining the gain and phase shift of the system by comparing the response signal to the input signal, the comparison including:
adjusting a relative phase difference of the detected response signal and input signal by performing a relative shift of the signals on a time axis; and
curve fitting the phase adjusted signals to identify a phase difference adjustment which gives the best fit of the input signal to the response signal, wherein the phase measurement of the response signal is determined from the best fit phase difference adjustment.

11. The method of claim 10, further comprising relatively adjusting amplitudes of the response signal and input signal; and
curve fitting the amplitude adjusted signals to identify an amplitude adjustment which gives the best fit of the input signal to the response signal, wherein the gain measurement of the response signal is determined from the best fit amplitude adjustment, the curve fitting for phase and gain determination being performed in concert to obtain the best fit to the input waveform.

12. The method of claim 10, wherein the signal source generates an input signal having an arbitrary waveform.

13. The method of claim 12, wherein the arbitrary waveform is defined by a single sinusoidal waveform or a plurality of superimposed sinusoidal waveforms.

14. The method of claim 13 wherein the arbitrary waveform is periodic and the stored waveform includes at least a portion of one full cycle from which a full cycle of the arbitrary waveform can be reconstituted.

15. The method of claim 13 wherein the arbitrary waveform is periodic and the stored waveform includes at least one full cycle of the arbitrary waveform.

16. The method as claimed in claims 10, wherein the input signal is also applied to a reference system the dynamic properties of which are known.

17. The method as claimed in claims 10, wherein the response signal comprises a response component and a background component and by comparing the response signal to the input signal the signal analyzing system identifies the background component from the response component while determining the gain and phase shift of the system.

18. The method of claim 17, wherein the response component of the response signal of the system under test is compared to a response of the reference system to compensate for artefacts of the measurement system or the transducers used to interface to the system under test.

19. The method of claim 10, wherein the signal detection device samples the response signal in response to clock pulses generated by the clocking system such that the sampling of the response signal is synchronized with the generation of the input signal and the curve fitting process minimizes the square of the deviation of the sampled response component from the known input signal and comprises mathematically fitting the response signal to the input signal to identify the background component the mathematical fitting process acting as a digital filter to reduce the effect of the background component in determining the dynamic characteristic of the system under test and wherein the DC offset is obtained by taking the average value of the response signal over a complete cycle.

20. The method as claimed in claim 10, further comprising feeding back of the response signal for use in calibrating the input signal wherein the feedback is used to:
a) adjust the amplitude of the input signal to maintain operation of the measurement system and the system under test within a linear range;
b) adjust the gain and offset of the input signal to produce a response signal of near maximum amplitude and minimum offset without clipping of the response signal; and or;
c) provides compensation for errors introduced by the spectral phase and gain response of any one or more of amplifiers, ADCs and other circuitry in the system.

* * * * *

UNITED STATES PATENT AND TRADEMARK OFFICE
CERTIFICATE OF CORRECTION

PATENT NO. : 8,519,719 B2  Page 1 of 1
APPLICATION NO. : 12/303869
DATED : August 27, 2013
INVENTOR(S) : Coster et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1209 days.

Signed and Sealed this

Fifteenth Day of September, 2015

Michelle K. Lee
*Director of the United States Patent and Trademark Office*